United States Patent
Oshima

(10) Patent No.: US 10,539,885 B2
(45) Date of Patent: Jan. 21, 2020

(54) PATTERN MANUFACTURING APPARATUS, PATTERN MANUFACTURING METHOD, AND PATTERN MANUFACTURING PROGRAM

(71) Applicant: KANTATSU CO., LTD., Yaita-shi, Tochigi (JP)

(72) Inventor: Eiji Oshima, Tochigi (JP)

(73) Assignee: KANTATSU CO., LTD., Yaita-shi (JP)

( * ) Notice: Subject to any disclaimer, the term of this patent is extended or adjusted under 35 U.S.C. 154(b) by 0 days.

(21) Appl. No.: 15/681,720

(22) Filed: Aug. 21, 2017

(65) Prior Publication Data
US 2018/0088471 A1 Mar. 29, 2018

(30) Foreign Application Priority Data
Sep. 26, 2016 (JP) .................... 2016-186394

(51) Int. Cl.
*G03F 7/20* (2006.01)
*G03F 7/38* (2006.01)
*G03F 7/34* (2006.01)

(52) U.S. Cl.
CPC .......... *G03F 7/70791* (2013.01); *G03F 7/203* (2013.01); *G03F 7/2053* (2013.01); *G03F 7/343* (2013.01); *G03F 7/38* (2013.01); *G03F 7/7045* (2013.01); *G03F 7/70191* (2013.01); *G03F 7/70208* (2013.01); *G03F 7/70541* (2013.01); *H05K 2201/09936* (2013.01)

(58) Field of Classification Search
CPC .. G03F 7/203; G03F 7/70191; G03F 7/70208; G03F 7/7045; G03F 7/70541; G03F 7/70791; G03F 7/2053; G03F 7/343; G03F 7/38; H05K 2201/09936
See application file for complete search history.

(56) References Cited

U.S. PATENT DOCUMENTS 3,891,441 A 6/1975 Tsuji et al.
4,304,839 A 12/1981 Cohen et al.
(Continued)

FOREIGN PATENT DOCUMENTS

| CN | 103261302 A | 8/2013 |
| CN | 1032613202 A | 8/2013 |

(Continued)

OTHER PUBLICATIONS

U.S. Appl. No. 15/681,217, filed Aug. 18, 2017.
(Continued)

*Primary Examiner* — Deoram Persaud
(74) *Attorney, Agent, or Firm* — Hamre, Schumann, Mueller & Larson, P.C.

(57) ABSTRACT

A pattern forming photo-curing layer is heated, thereby enabling quick shaping. A pattern manufacturing apparatus (100) includes a controller (101), a laser projector (102), and a heater (103). The controller (101) controls the laser projector (102) to form a pattern on a pattern forming sheet (130) placed on a stage (140). The laser projector (102) includes an optical engine (121), and the controller (101) controls the laser projector (102) to irradiate the pattern forming sheet (130) with a light beam from the optical engine (121). The heater (103) heats the pattern forming sheet (130).

11 Claims, 14 Drawing Sheets

(56) References Cited

U.S. PATENT DOCUMENTS

| | | | |
|---|---|---|---|
| 5,679,268 A | 10/1997 | Takahashi et al. | |
| 5,708,251 A * | 1/1998 | Naveh | B29D 23/005 219/121.66 |
| 6,115,106 A * | 9/2000 | Kohda | G03B 27/32 355/18 |
| 8,080,350 B2 | 12/2011 | Banba et al. | |
| 2003/0215574 A1* | 11/2003 | Ishino | G02B 5/201 427/385.5 |
| 2003/0231234 A1* | 12/2003 | Ushirogouchi | B41J 2/0057 347/100 |
| 2004/0223129 A1 | 11/2004 | Ishikawa et al. | |
| 2005/0037281 A1 | 2/2005 | Sato et al. | |
| 2006/0152105 A1* | 7/2006 | Aksyuk | G01J 5/40 310/307 |
| 2006/0269217 A1 | 11/2006 | Shirota et al. | |
| 2009/0091730 A1 | 4/2009 | Tanaka | |
| 2009/0173723 A1 | 7/2009 | Nakagawa et al. | |
| 2009/0286173 A1 | 11/2009 | Ushirokawa et al. | |
| 2011/0111968 A1* | 5/2011 | Okura | B01L 7/00 506/7 |
| 2012/0037297 A1* | 2/2012 | Nardo | B29C 61/00 156/86 |
| 2013/0285366 A1* | 10/2013 | Tailor | B29C 65/3668 285/21.2 |
| 2013/0288002 A1 | 10/2013 | Hwang et al. | |
| 2013/0292862 A1 | 11/2013 | Joyce | |
| 2013/0308111 A1 | 11/2013 | Lee et al. | |
| 2013/0314683 A1 | 11/2013 | Watanabe et al. | |
| 2015/0223320 A1 | 8/2015 | Gerhäußer | |
| 2017/0232669 A1 | 8/2017 | Watanabe et al. | |
| 2018/0087897 A1 | 3/2018 | Oshima et al. | |
| 2018/0139849 A1 | 5/2018 | Oshima et al. | |
| 2018/0222108 A1 | 8/2018 | Oshima et al. | |
| 2018/0297274 A1 | 10/2018 | Oshima et al. | |
| 2018/0339455 A1* | 11/2018 | Cohen | C12M 33/00 |

FOREIGN PATENT DOCUMENTS

| | | |
|---|---|---|
| CN | 107660033 A | 2/2018 |
| JP | 08-230048 A | 9/1996 |
| JP | 2000-238137 A | 9/2000 |
| JP | 2003-039564 A | 2/2003 |
| JP | 2004-022623 A | 1/2004 |
| JP | 2004-128418 | 4/2004 |
| JP | 2004-128418 A | 4/2004 |
| JP | 2004-281738 A | 10/2004 |
| JP | 2006-319138 A | 11/2006 |
| JP | 2012-014015 A | 1/2012 |
| JP | 2012-119410 | 6/2012 |
| JP | 2012-119410 A | 6/2012 |
| JP | 2012-194253 A | 10/2012 |
| JP | 2013-67016 A | 4/2013 |
| JP | 2013-075389 A | 4/2013 |
| JP | 2013-235202 A | 11/2013 |
| JP | 2014-192275 A | 10/2014 |
| JP | 2017-203199 A | 11/2017 |

OTHER PUBLICATIONS

International Search Report for PCT/JP2016/065642, dated Jul. 12, 2016.
International Search Report for PCT/JP2016/066225, dated Aug. 16, 2016.
Office Action issued in Chinese Application No. 201721112419.1, dated Feb. 13, 2018.
Co-pending U.S. Appl. No. 15/569,058, filed Oct. 24, 2017.
Co-pending U.S. Appl. No. 15/569,070, filed Oct. 24, 2017.
Co-pending U.S. Appl. No. 15/873,696, filed Jan. 17, 2018.
Office Action issued in U.S. Appl. No. 15/681,217, dated Apr. 18, 2018.
Office Action issued in U.S. Appl. No. 15/569,070, dated Apr. 17, 2018.
Office Action issued in Chinese Application No. 201721112370.X, dated Apr. 28, 2018.
Co-pending U.S. Appl. No. 15/681,217, filed Aug. 18, 2017.
Office Action for Japanese Patent Application No. 2015-116660, dated Aug. 21, 2018.
Office Action for Japanese Patent Application No. 2015-1116660, dated Aug. 21, 2018.
Office Action issued in co-pending U.S. Appl. No. 15/681,217, dated Oct. 22, 2018.
Office Action issued in co-pending U.S. Appl. No. 15/569,070, dated Oct. 25, 2018.
Co-pending U.S. Appl. No. 16/146,696, filed Sep. 28, 2018.
Co-pending U.S. Appl. No. 16/146,780, filed Sep. 28, 2018.
Co-pending U.S. Appl. No. 16/146,851, filed Sep. 28, 2018.
Office Action issued in co-pending U.S. Appl. No. 15/569,058, dated Nov. 5, 2018.
Report of Reconsideration by Examiner Before Appeal, issued in Japanese Patent Application No. 2015-116660, dated Dec. 13, 2018.
U.S. Appl. No. 16/146,696, filed Sep. 28, 2018.
U.S. Appl. No. 16/146,780, filed Sep. 28, 2018.
U.S. Appl. No. 16/146,851, filed Sep. 28, 2018.
Office Action issued in co-pending U.S. Appl. No. 15/681,217, dated Feb. 6, 2019.
Office Action issued in co-pending U.S. Appl. No. 15/569,058, dated Mar. 5, 2019.
Co-pending U.S. Appl. No. 16/375,749, filed Apr. 4, 2019.
Co-pending U.S. Appl. No. 16/386,080, filed Apr. 16, 2019.

* cited by examiner

PATTERN MANUFACTURING APPARATUS, PATTERN MANUFACTURING METHOD, AND PATTERN MANUFACTURING PROGRAM

CROSS-REFERENCE TO RELATED APPLICATION

This application claims the benefit of Japanese Patent Application No. 2016-186394, filed on Sep. 26, 2016, which is hereby incorporated by reference in its entirety.

BACKGROUND OF THE INVENTION

Field of the Invention

The present invention relates to a pattern manufacturing apparatus, a pattern manufacturing method, and a pattern manufacturing program.

Description of the Related Art

In the above technical field, patent literature 1 discloses a technique of irradiating, with light, a photomask on which a circuit pattern is formed, and exposing the circuit pattern on a board.

[Patent Literature 1] Japanese Patent Laid-Open No. 2012-194253

SUMMARY OF THE INVENTION

In the technique described in the above literature, since no heater is provided, it is impossible to heat a pattern forming photo-curing layer, thereby disabling quick shaping.

The present invention enables to provide a technique of solving the above-described problem.

One aspect of the present invention provides a pattern manufacturing apparatus comprising:

a forming unit that forms a pattern by irradiating a pattern forming photo-curing layer with a light beam; and a heater that heats the pattern forming photo-curing layer.

Another aspect of the present invention provides a pattern manufacturing method comprising:

forming a pattern by irradiating a pattern forming photo-curing layer with a light beam; and heating the pattern forming photo-curing layer.

Still other aspect of the present invention provides a pattern manufacturing program for causing a computer to execute a method, comprising:

forming a pattern by irradiating a pattern forming photo-curing layer with a light beam; and heating the pattern forming photo-curing layer.

According to the present invention, it is possible to heat a pattern forming photo-curing layer, thereby enabling quick shaping.

DESCRIPTION OF THE EXAMPLE EMBODIMENTS

Example embodiments of the present invention will now be described in detail with reference to the drawings. It should be noted that the relative arrangement of the components, the numerical expressions and numerical values set forth in these example embodiments do not limit the scope of the present invention unless it is specifically stated otherwise.

[First Example Embodiment]

A pattern manufacturing apparatus 100 according to the first example embodiment of the present invention will be described with reference to FIGS. 1 to 7. The pattern manufacturing apparatus 100 is an apparatus that manufactures a pattern on an arbitrary work surface by irradiating a pattern forming sheet with a light beam.

<Technical Premise>

The technical premise of this example embodiment will be described first. Note that a circuit pattern will be exemplified as a pattern. However, the technique of this example embodiment is not limited to this.

In general, a circuit pattern is determined by designing a PCB (Printed Circuit Board) using CAD (Computer Aided Design) such as PADS (Personal Automated Design System). After that, the circuit pattern is manufactured by a subcontracting maker using silk screen printing or a photoresist method. There is an increasing need to examine, using an actual product, whether the design of a circuit pattern is appropriate in addition to confirmation on the screen of a personal computer or the like in these design processes.

In a conventional circuit pattern development method, a circuit pattern printing mask to be used for screen printing or a photoresist method needs to be subcontracted and manufactured. This poses a problem that a long time and a high cost are required to actually complete a prototype. To reduce the time and cost, development of a circuit pattern is often advanced by only confirming, on the monitor of a personal computer or the like, a circuit pattern created by CAD or CAE (Computer Aided Engineering). It is, however, difficult to completely grasp a problem by confirming data of the circuit pattern displayed on the monitor. In many cases, therefore, the problem is noticed only after a prototype is manufactured. To cope with this, a mask needs to be subcontracted to manufacture a prototype, thereby increasing the time and cost to complete the prototype. Furthermore, in a method using a mask, such as screen printing, for example, it is impossible to manufacture a circuit pattern for a housing, its curved portion or corner portion, or the like.

<Technique of Example Embodiment>

Figure 1:
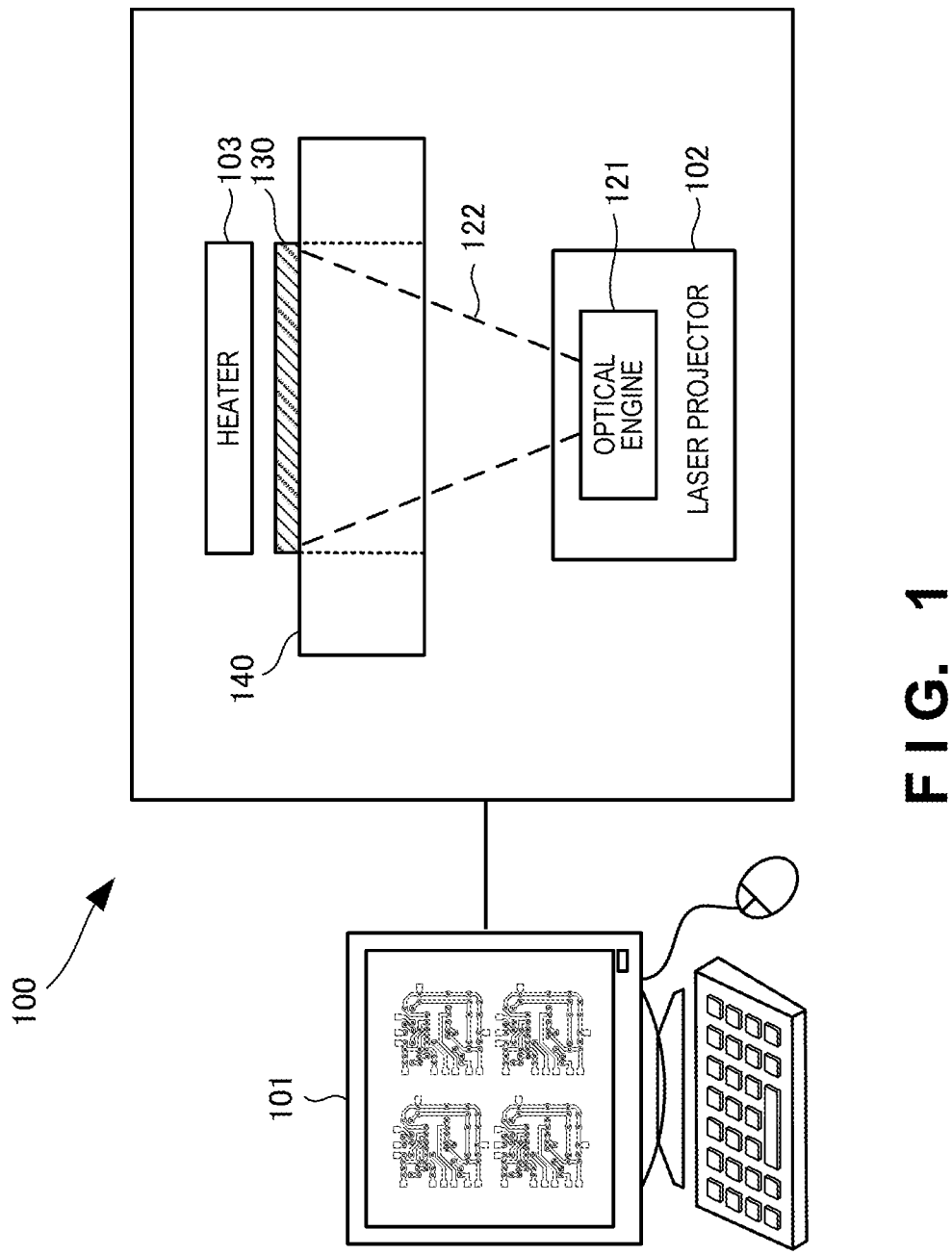
FIG. 1 is a schematic view for explaining an outline of the overall arrangement of a pattern manufacturing apparatus according to the first example embodiment of the present invention.

FIG. 1 is a schematic view for explaining an outline of the overall arrangement of the pattern manufacturing apparatus 100 according to this example embodiment. As shown in FIG. 1, the pattern manufacturing apparatus 100 includes a controller 101, a laser projector 102, and a heater 103. The controller 101 controls the laser projector 102 to form a pattern on a pattern forming sheet 130 adhered to a work on a stage 140. That is, the controller 101 forms a pattern on the pattern forming sheet 130 by performing irradiation with a light beam 122 from an optical engine 121 based on pattern data created by CAD. The stage 140 has a hollow structure not to obstruct the optical path of the light beam 122, and the pattern forming sheet 130 placed on the stage 140 is irradiated with the light beam 122 from below. Note that creation of pattern data is not limited to CAD. For example, an application of a smartphone, CAE, or the like may be used to create pattern data. The controller 101 also controls the overall operation of the pattern manufacturing apparatus 100. Note that the pattern forming sheet 130 is flexible, and can thus conform to a work having an arbitrary surface shape. The pattern forming sheet 130 includes a light-transmitting sheet material layer and a photo-curing layer applied to the sheet material layer.

The laser projector 102 includes the optical engine 121. The controller 101 controls the laser projector 102 to irradiate the pattern forming sheet 130 with the light beam from the optical engine 121. The heater 103 heats the pattern forming sheet 130.

Figure 2A:
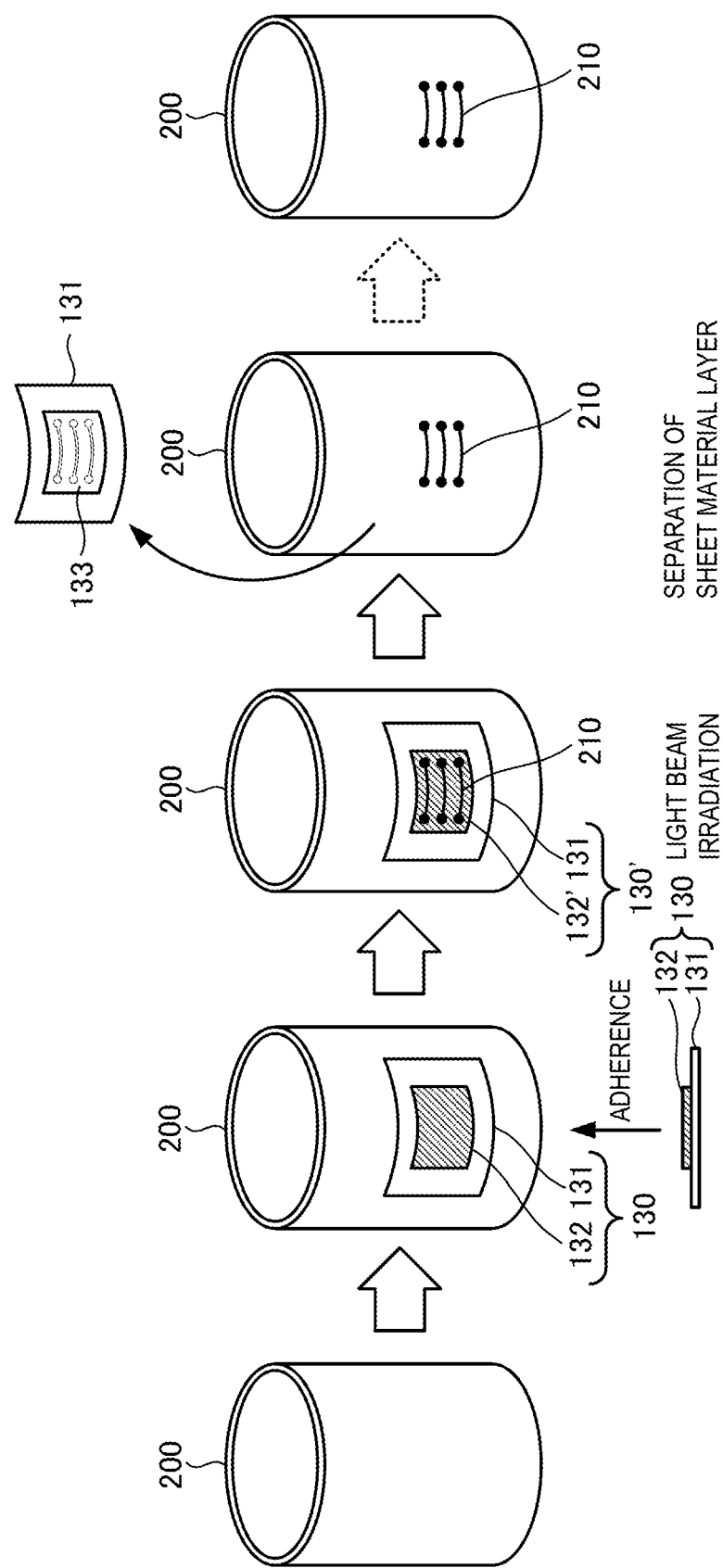
FIG. 2A is a view showing an outline of a pattern forming process by the pattern manufacturing apparatus according to the first example embodiment of the present invention.

FIG. 2A is a view showing an outline of a pattern forming process by the pattern manufacturing apparatus 100 according to this example embodiment. A case in which a pattern is formed on a cylindrical glass serving as a work 200, as shown in the leftmost view of FIG. 2A, will be exemplified. The glass has a curved shape as a surface shape. As shown in the second view from the left of FIG. 2A, the pattern forming sheet 130 is adhered so that a photo-curing layer 132 contacts the surface of the glass. As shown in the middle view of FIG. 2A, based on the pattern data created by the controller 101, irradiation with the light beam 122 is performed from the side of a sheet material layer 131 of the pattern forming sheet 130 adhered to the surface of the glass. The pattern forming sheet 130 is changed to a pattern forming sheet 130' on which a pattern 210 is formed in a photo-curing layer 132'. The irradiation time of the light beam 122 changes depending on an irradiation area and laser power but falls within the range of about 1 to 20 min.

As shown in the second view from the right of FIG. 2A, upon completion of irradiation with the light beam 122, the sheet material layer 131 is separated. If the sheet material layer 131 is separated, a portion of the photo-curing layer 132', which is cured by irradiation with the light beam 122, remains on the glass side, and the formed pattern 210 is manufactured on the surface of the glass. An uncured portion 133 other than the pattern 210 is separated together with the sheet material layer 131. At this time, if the uncured portion of the photo-curing layer 132 remains on the surface of the glass, the remaining uncured portion is cleaned and removed, as shown in the rightmost view of FIG. 2A. Note that if no uncured portion remains on the surface of the glass, cleaning is not necessary. The cylindrical glass has been exemplified as the work 200. However, the surface shape of the work 200 to which the pattern forming sheet 130 is adhered is an arbitrary surface shape such as a flat surface, corner surface, or curved surface.

Figure 2B:
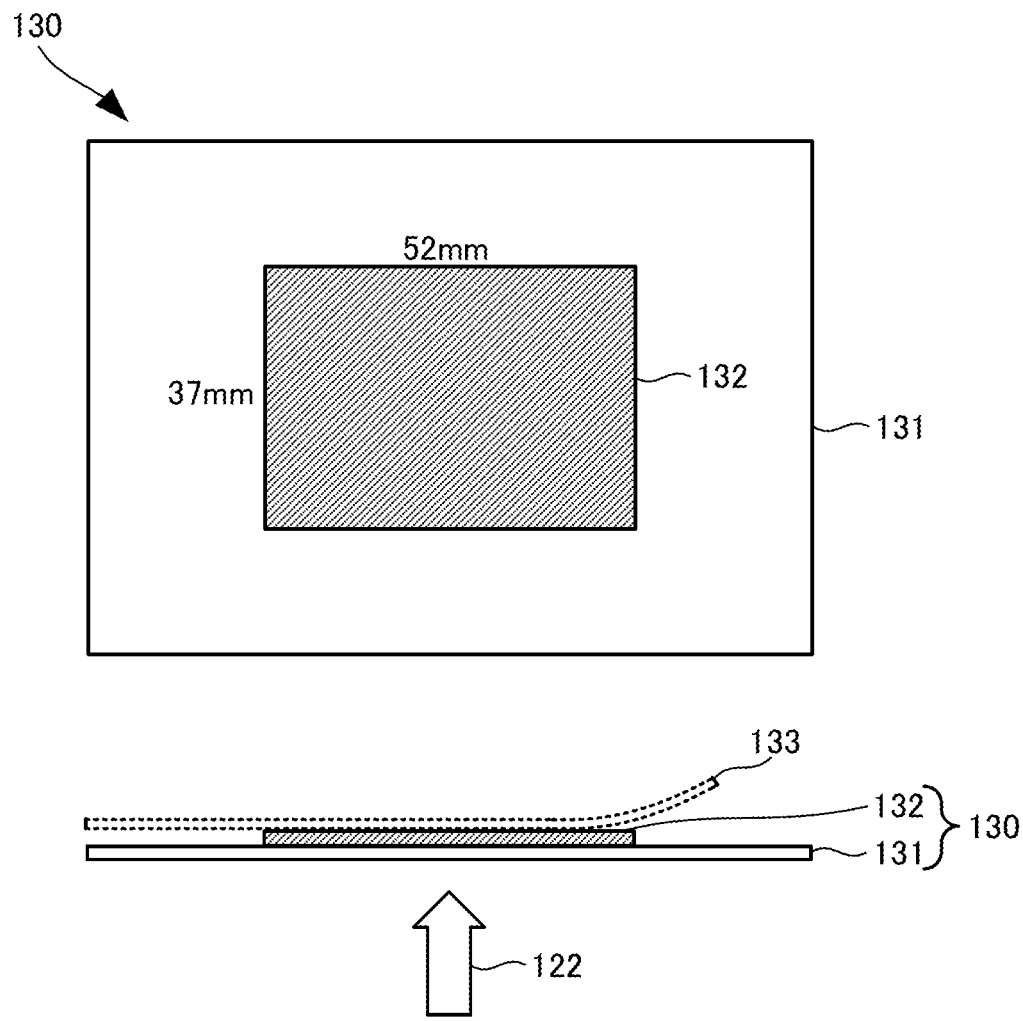
FIG. 2B shows a plan view and a side view for explaining the arrangement of a pattern forming sheet used in the pattern manufacturing apparatus according to the first example embodiment of the present invention.

FIG. 2B shows a plan view and a side view for explaining the arrangement of the pattern forming sheet 130 used in the pattern manufacturing apparatus 100 according to this example embodiment.

The pattern forming sheet 130 includes the light-transmitting sheet material layer 131 and the photo-curing layer 132 applied to the sheet material layer 131. The photo-curing layer 132 is a paste-like layer containing a photo-curing resin. The sheet material layer 131 is a sheet having high light transmittance and releasability. As the sheet material layer 131, a sheet made of polyolefin, polypropylene, polyethylene, polyimide, or the like, a sheet obtained by performing surface processing of a high separation performance for the above sheet, or the like is used. The present invention, however, is not limited to them. The sheet material layer 131 has flexibility to fit in an arbitrary shape of a work surface.

The photo-curing layer 132 contains a photo-curing resin. The photo-curing layer 132 is applied to the sheet material layer 131 in a size of about 37 mm in the vertical direction× about 52 mm in the horizontal direction, which corresponds to an A9 size. Note that the size of the photo-curing layer 132 to be applied is not limited to this. The photo-curing layer 132 may further contain a conductive material. By containing a conductive material in the photo-curing layer 132, for example, the pattern forming sheet 130 can be used to form a circuit pattern. Examples of the conductive material are silver, gold, copper, platinum, lead, zinc, tin, iron, aluminum, palladium, and carbon. The present invention, however, is not limited to them.

If the pattern forming sheet 130 is adhered to the work 200 and installed, and irradiated with the light beam 122 from the side of the sheet material layer 131, the photo-curing layer 132 is irradiated with the light beam 122 transmitted through the sheet material layer 131. A portion of the photo-curing layer 132, which has been irradiated with the light beam 122, is cured.

The emitted light beam 122 is a laser having a wavelength of about 405 nm but is not limited to this. The light beam 122 may be, for example, a light beam having a wavelength of 200 nm to 400 nm but is not limited to this. If the sheet material layer 131 is separated after completion of irradiation with the light beam 122, the cured portion of the photo-curing layer 132 remains on the side of the work 200 and the uncured portion is separated from the work 200 together with the sheet material layer 131, thereby forming the pattern on the work 200.

The protection sheet 133 for protecting the photo-curing layer 132 of the pattern forming sheet 130 may be provided. The protection sheet 133 is a sheet made of a material of a high separation performance, such as polytetrafluoroethylene (PTFE). The protection sheet 133 need only be a sheet made of a material that is readily separated while protecting the photo-curing layer 132. If the protection sheet 133 is provided, the pattern forming sheet 130 can be carried and stored without damaging the photo-curing layer 132.

Note that the photo-curing layer 132 may be mixed with ink that develops a color in accordance with the wavelength, output, and irradiation time of the light beam. Furthermore, the photo-curing layer 132 may be mixed with ink that develops a different color in accordance with the wavelength, output, and irradiation time of the light beam.

Figure 2C:
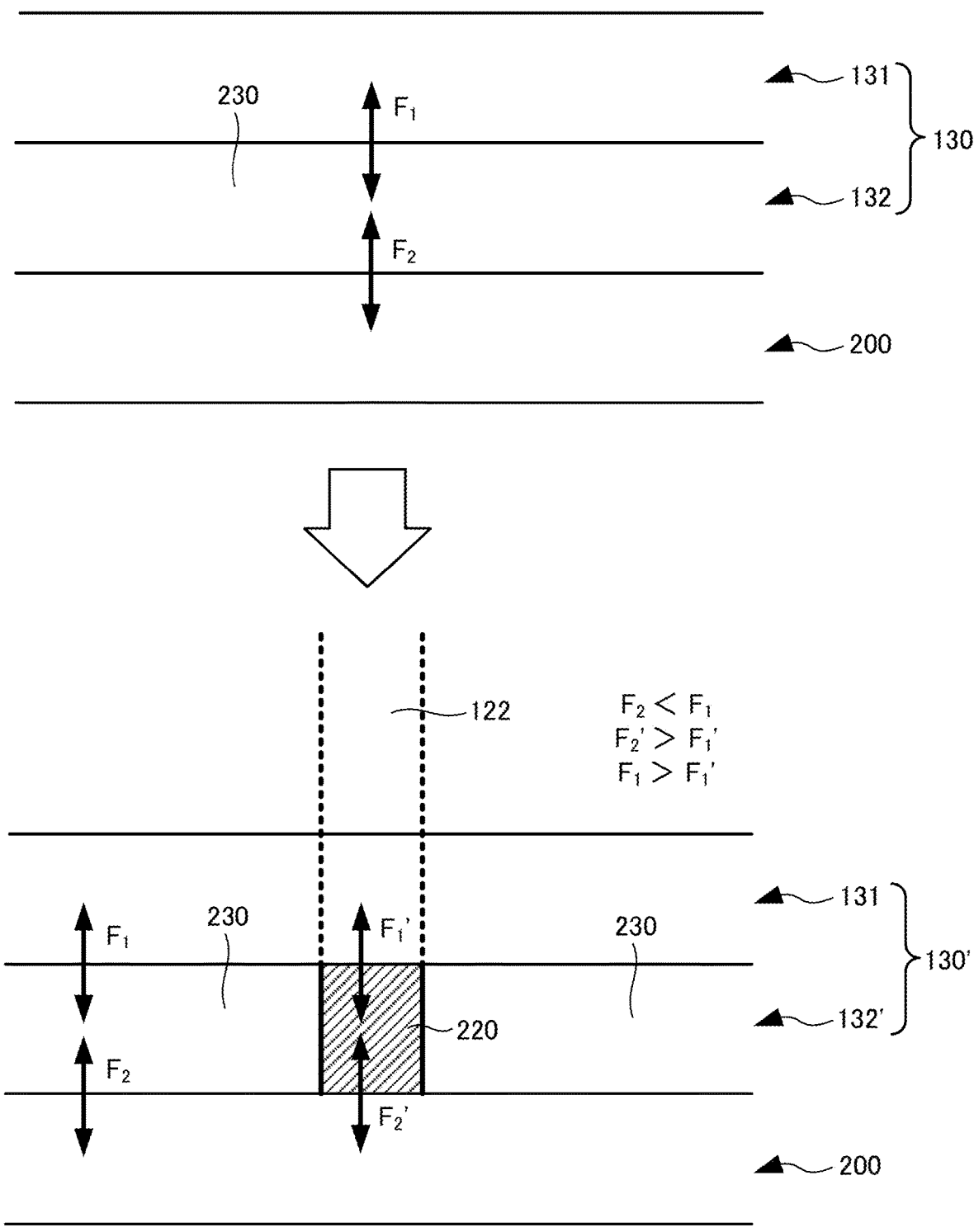
FIG. 2C is a view for explaining the pattern forming sheet used in the pattern manufacturing apparatus and the adhesion of a pattern forming sheet after light beam irradiation according to the first example embodiment of the present invention.

FIG. 2C is a view for explaining the pattern forming sheet 130 used in the pattern manufacturing apparatus 100 and the adhesion of the pattern forming sheet 130' after light beam irradiation according to this example embodiment. The adhesion between the sheet material layer 131 and an uncured portion 230 of the photo-curing layer 132 is represented by $F_1$, and the adhesion between the work 200 and the uncured portion 230 of the photo-curing layer 132 is represented by $F_2$.

After irradiation with the light beam 122, a portion where no pattern is formed, that is, a portion that is not irradiated with the light beam 122 such as a laser beam needs to be separated together with the sheet material layer 131 when the sheet material layer 131 is separated. Therefore, in this portion, instead of separating the sheet material layer 131 from the photo-curing layer 132', the sheet material layer 131 and the photo-curing layer 132' remain adhered to each other and the photo-curing layer 132' needs to be readily separated from the work 200. Therefore, the adhesions desirably satisfy a relation of $F_2 < F_1$.

Furthermore, the adhesion between the sheet material layer 131 and a cured portion 220 of the photo-curing layer 132' is represented by $F_1'$ and the adhesion between the work 200 and the cured portion 220 of the photo-curing layer 132' is represented by $F_2'$. The adhesions desirably satisfy a relation of $F_2' > F_1'$.

Furthermore, when viewed from the side of the sheet material layer 131, the relation between the adhesions is desirably $F_1 > F_1'$.

The photo-curing resin contained in the photo-curing layer 132 is, for example, an ultraviolet curing resin such as an acrylic resin (polymer acrylate), urethane resin (urethane acrylate), vinyl ester resin, or polyester-alkyd resin (epoxy acrylate). However, the photo-curing resin contained in the photo-curing layer 132 is not limited to this as long as a resin is cured by light beam irradiation.

If the pattern forming sheet 130 has the above arrangement, the releasability between the sheet material layer 131 and the cured portion 220 of the photo-curing layer 132 is improved, and it is possible to readily separate the sheet material layer 131 and the photo-curing layer 132.

Figure 2D:
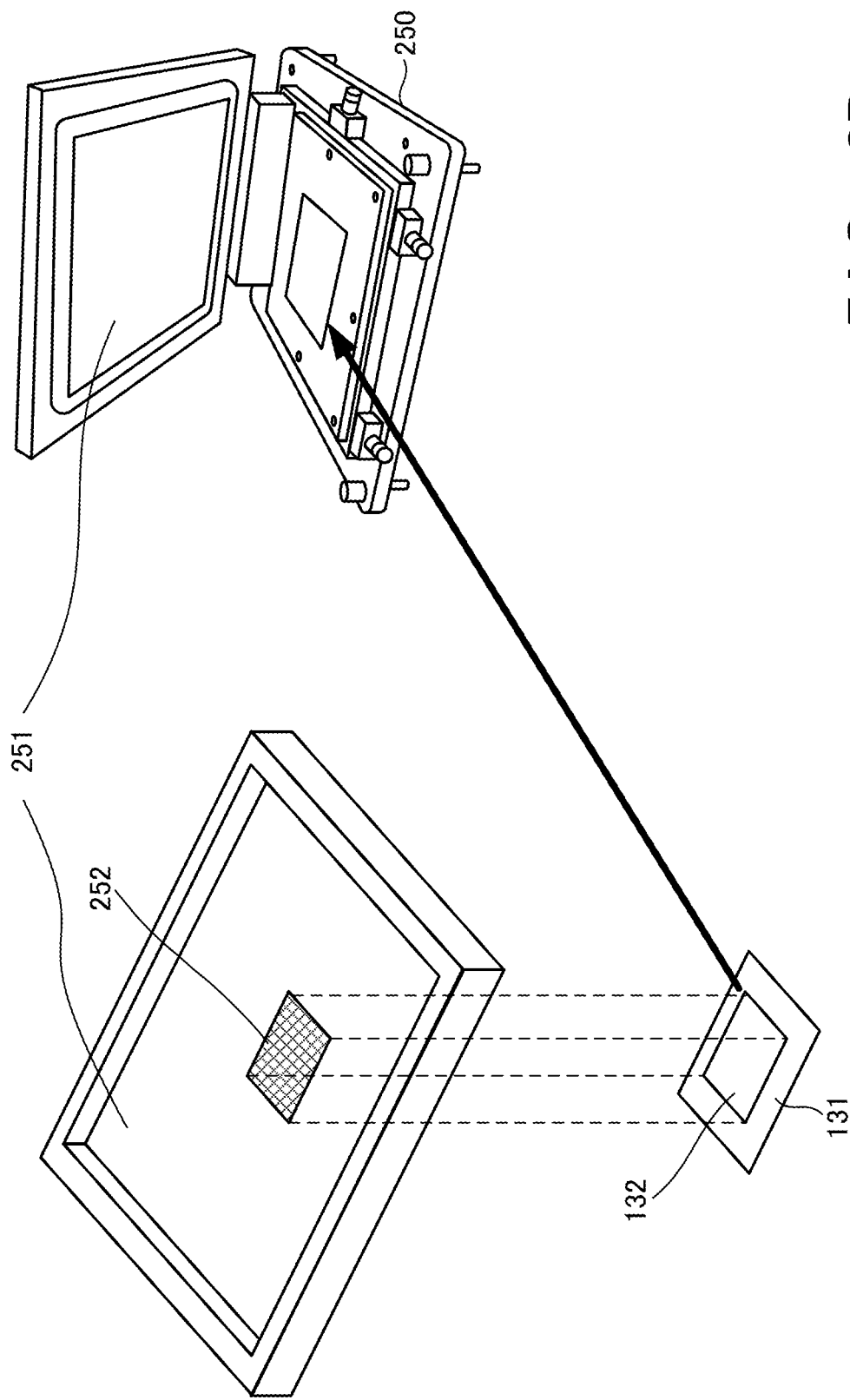
FIG. 2D is a view for explaining an example of a method of applying the photo-curing layer of the pattern forming sheet used in the pattern manufacturing apparatus according to the first example embodiment of the present invention.

FIG. 2D is a view for explaining an example of the method of applying the photo-curing layer 132 of the pattern forming sheet 130 used in the pattern manufacturing apparatus 100 according to this example embodiment. The photo-curing layer 132 is applied to the sheet material layer 131 by setting, in a screen printing machine 250, a silk screen film 251 provided with an application region 252. The photo-curing layer 132 may be applied to the sheet material layer 131 directly using, for example, a select roller without using the screen printing machine 250.

Figure 3:
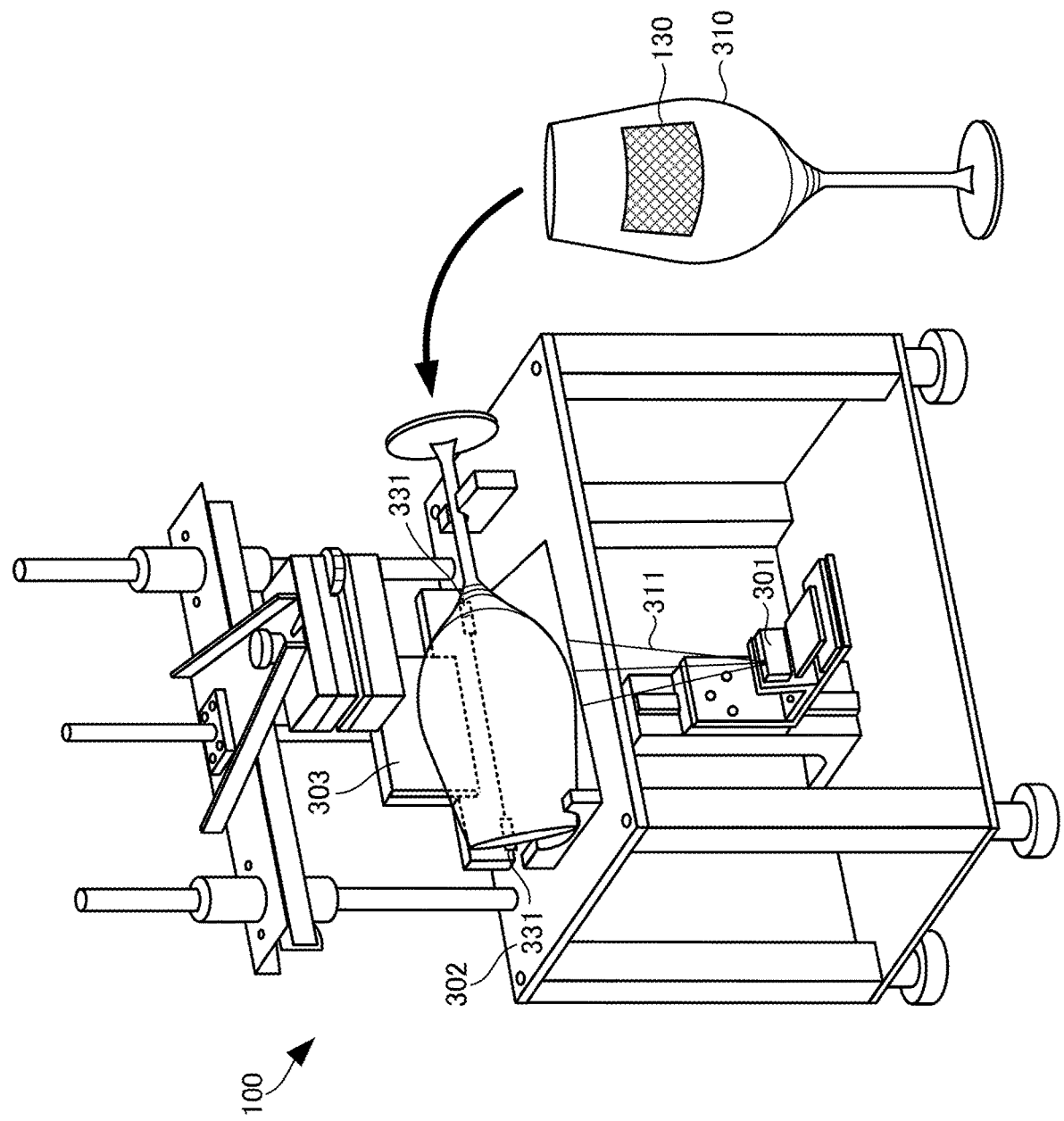
FIG. 3 is a view for explaining an example of the apparatus arrangement of the pattern manufacturing apparatus according to the first example embodiment of the present invention.

FIG. 3 is a view for explaining an example of the apparatus arrangement of the pattern manufacturing apparatus 100 according to this example embodiment. Note that FIG. 3 does not illustrate the controller 101 and the like, as appropriate. The pattern manufacturing apparatus 100 includes a light source unit 301, a stage 302, and a heater 303. The light source unit 301 emits a light beam 311 such as a laser beam. The light source unit 301 forms a forming unit that forms a pattern by irradiating the pattern forming sheet 130 with the light beam 311. The heater 303 is attached to the stage 302 via hinges 331, and rotates about the hinges 331. The heater 303 is set at a position where it is perpendicular to the stage 302. If the heater 303 is tilted to the near side in FIG. 3, the heater 303 is set at a position where it is parallel to the stage 302.

The heater 303 is, for example, a heating wire heater, an infrared heater, or the like, but is not limited to them. Furthermore, the heater 303 may include at least one or both of the heating wire heater and the infrared heater.

The use method of the pattern manufacturing apparatus 100 will be described using an example of forming a pattern on the surface of a wine glass 310 as the work 200. First, the pattern forming sheet 130 is adhered to the surface of the wine glass 310. The wine glass 310 to which the pattern forming sheet 130 is adhered is placed on the stage 302, and the pattern forming sheet 130 is then irradiated with the light beam 311 from the light source unit 301. Note that an example of manufacturing a pattern on the work 200 completed in advance, such as the wine glass 310, has been explained. However, the use method of the pattern manufacturing apparatus 100 is not limited to this. For example, a channel such as a pipe may be manufactured as the work 200 using the pattern manufacturing apparatus 100, and the pattern forming sheet 130 may be adhered to the manufactured channel, thereby manufacturing a pattern.

Figure 4A:
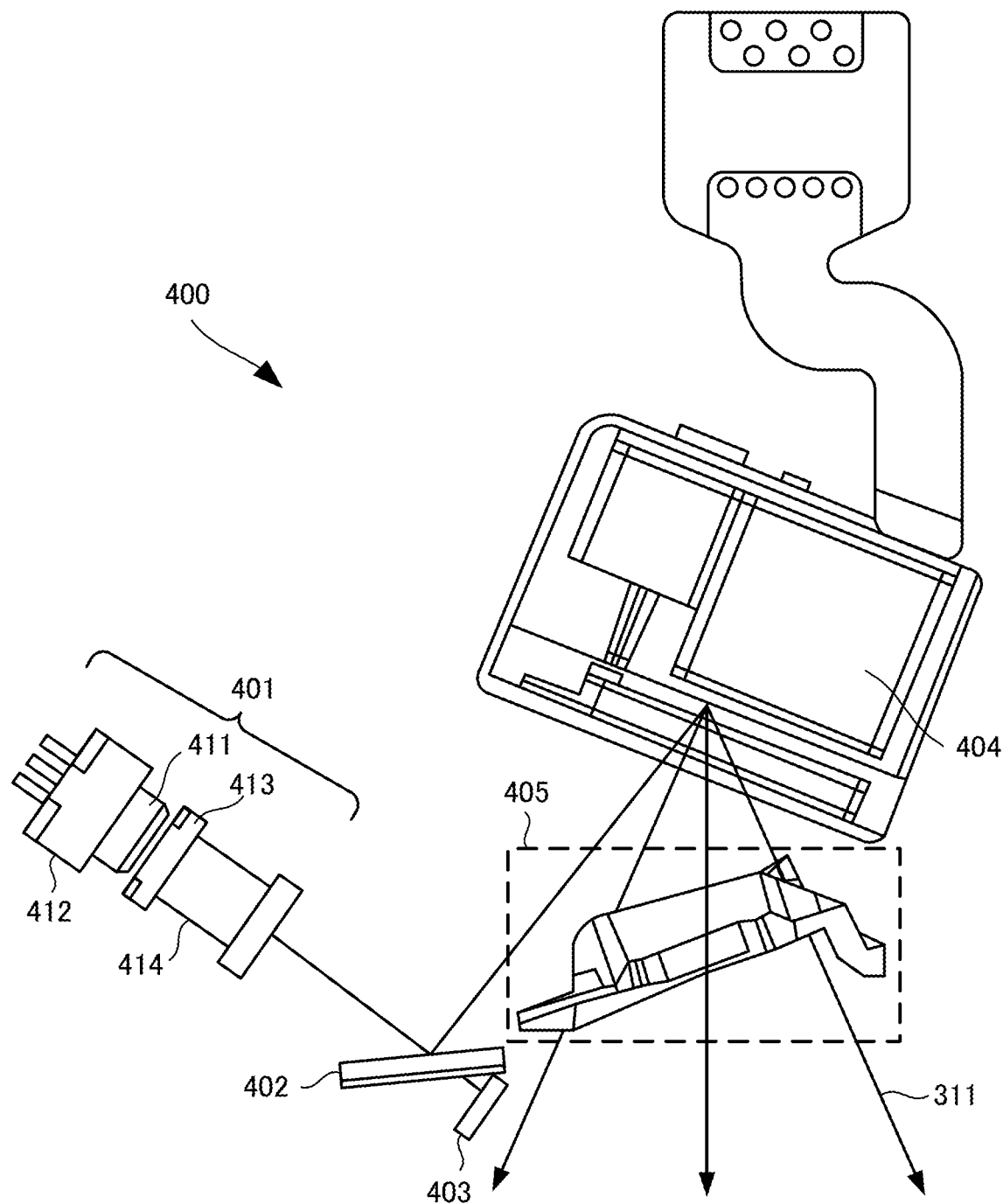
FIG. 4A is a view for explaining an example of the arrangement of an optical engine incorporated in the light source unit of the pattern manufacturing apparatus according to the first example embodiment of the present invention.

FIG. 4A is a view for explaining an example of the arrangement of an optical engine 400 incorporated in the light source unit 301 of the pattern manufacturing apparatus 100 according to this example embodiment.

The optical engine 400 includes a light source 401, a reflecting mirror 402, a photodetector 403, a two-dimensional MEMS (Micro Electro Mechanical System) mirror 404, and an angle-of-view correction element 405.

The light source 401 includes a semiconductor LD (Laser Diode) 411, an LD holder 412, a collimator lens 413, and a collimator holder 414. The semiconductor LD 411 is attached to the LD holder 412, and the collimator lens 413 is attached to the collimator holder 414. The semiconductor LD 411 is a laser beam oscillation element that oscillates an ultraviolet laser beam or the like. Note that the laser beam oscillation element is not limited to the semiconductor LD 411 and may be an LED (Light Emitting Diode).

A laser beam emitted from the semiconductor LD 411 is collimated by the collimator lens 413, travels toward the reflecting mirror 402, and is reflected by the reflecting mirror 402. The photodetector 403 detects the power of the laser beam, and controls the illuminance of the semiconductor LD 411. Then, the laser beam reflected by the reflecting mirror 402 enters the central portion of the two-dimensional MEMS mirror 404.

The two-dimensional MEMS mirror 404 is a driving mirror that is driven based on an externally input control signal, and vibrates to reflect the laser beam by changing an angle in the horizontal direction (X direction) and the vertical direction (Y direction). The angle of view of the laser beam reflected by the two-dimensional MEMS mirror 404 is corrected by the angle-of-view correction element 405. The laser beam whose angle of view has been corrected is scanned on the pattern forming sheet 130 and the pattern 210 is formed on the pattern forming sheet 130. Note that the LD holder 412, the collimator holder 414, and the angle-of-view correction element 405 are installed, as needed.

Figure 4B:
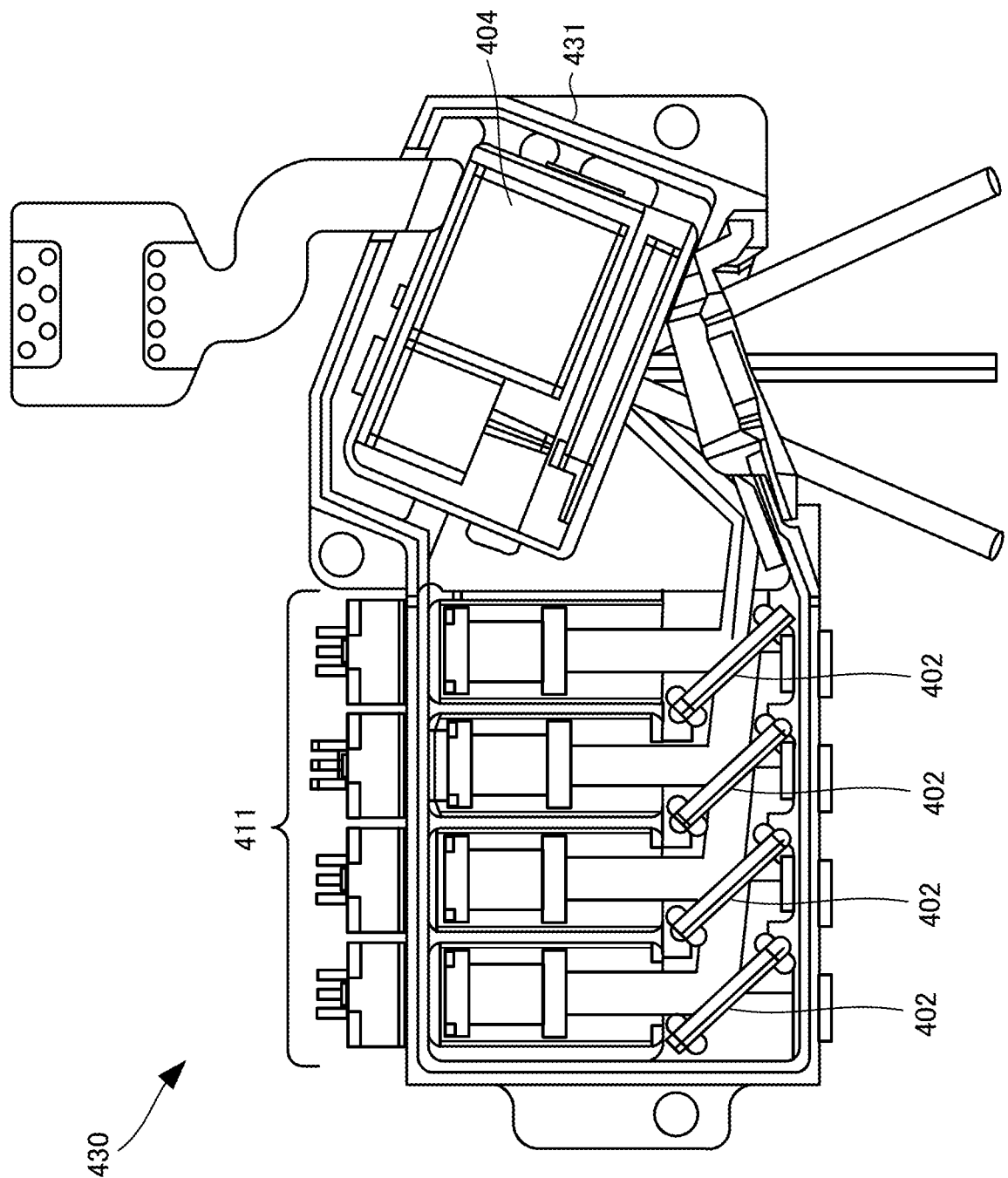
FIG. 4B is a plan view for explaining another example of the arrangement of the optical engine incorporated in the light source unit of the pattern manufacturing apparatus according to the first example embodiment of the present invention.
Figure 4C:
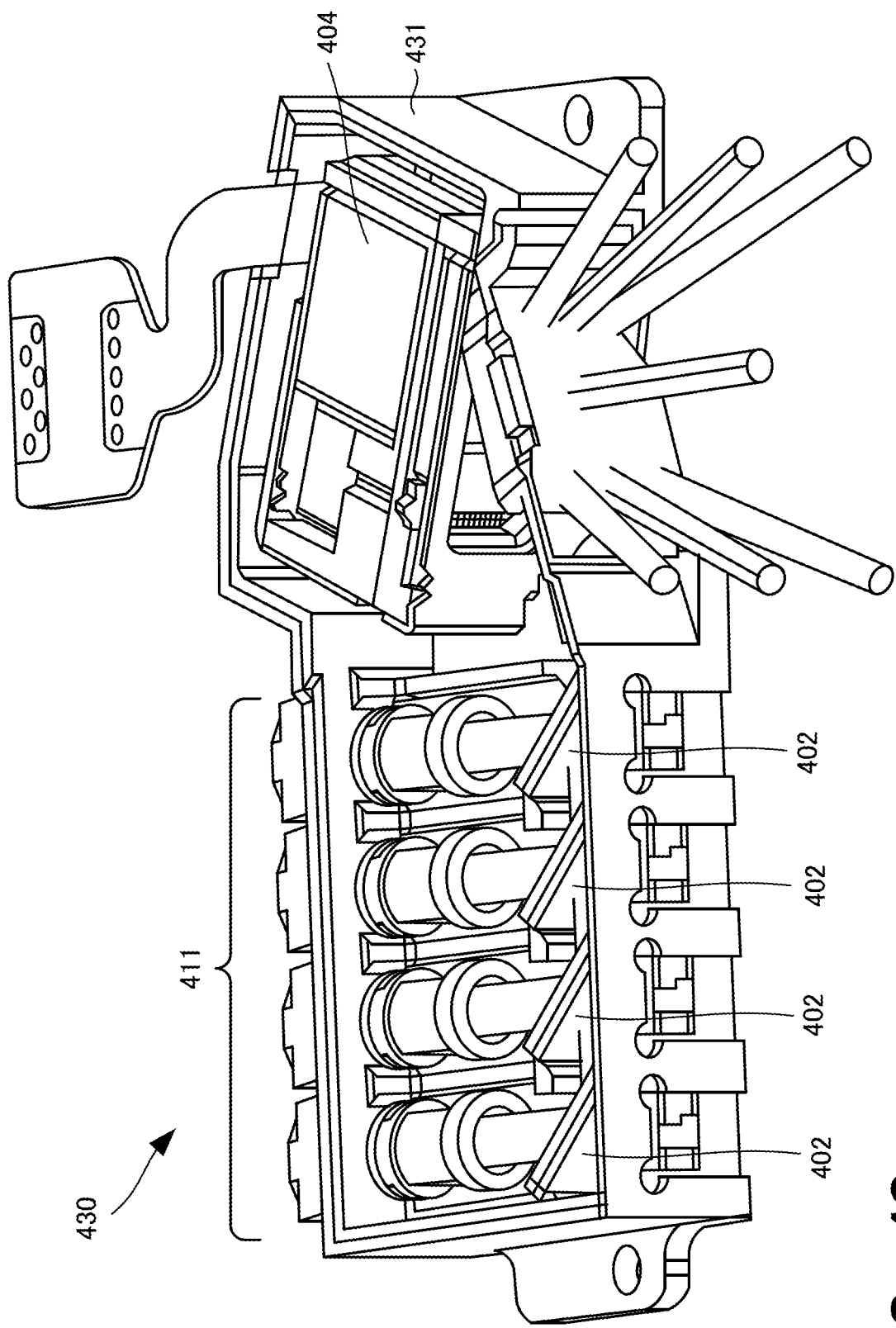
FIG. 4C is a perspective view for explaining the other example of the arrangement of the optical engine incorporated in the light source unit of the pattern manufacturing apparatus according to the first example embodiment of the present invention.

FIGS. 4B and 4C are a plan view and a perspective view for explaining another example of the arrangement of an optical engine 430 incorporated in the light source unit 301 of the pattern manufacturing apparatus 100 according to this example embodiment. FIGS. 4B and 4C show the optical engine 430 in which the four semiconductor LDs 411 are arranged in a housing 431. By arranging a number of semiconductor LDs 411, it is possible to increase the output of the optical engine 430, and implement the optical engine 430 according to the power. Note that the semiconductor LDs 411 may emit laser beams of different wavelengths and outputs. By providing a plurality of LDs that emit laser beams of different wavelengths, it is possible to select a wavelength in accordance with the purpose. By attaching a plurality of LDs that emit laser beams of the same wavelength and different beam diameters, it is possible to select a sharp or soft laser beam in an arbitrary place.

The optical engine 430 is an optical engine for a phenomenally downsized laser pico projector having a width of about 30 mm, a depth of about 15 mm, a height of about 7 mm, and a capacity of about 3 cc while achieving a resolution of 720p and high image quality. Note that the number of semiconductor LDs 411 arranged in the optical engine 430 is not limited to four, and one to three or five or more semiconductor LDs 411 may be arranged. By increasing/decreasing the number of the semiconductor LDs 411, it is possible to adjust the output of the laser beam emitted from the optical engine 430.

Figure 5:
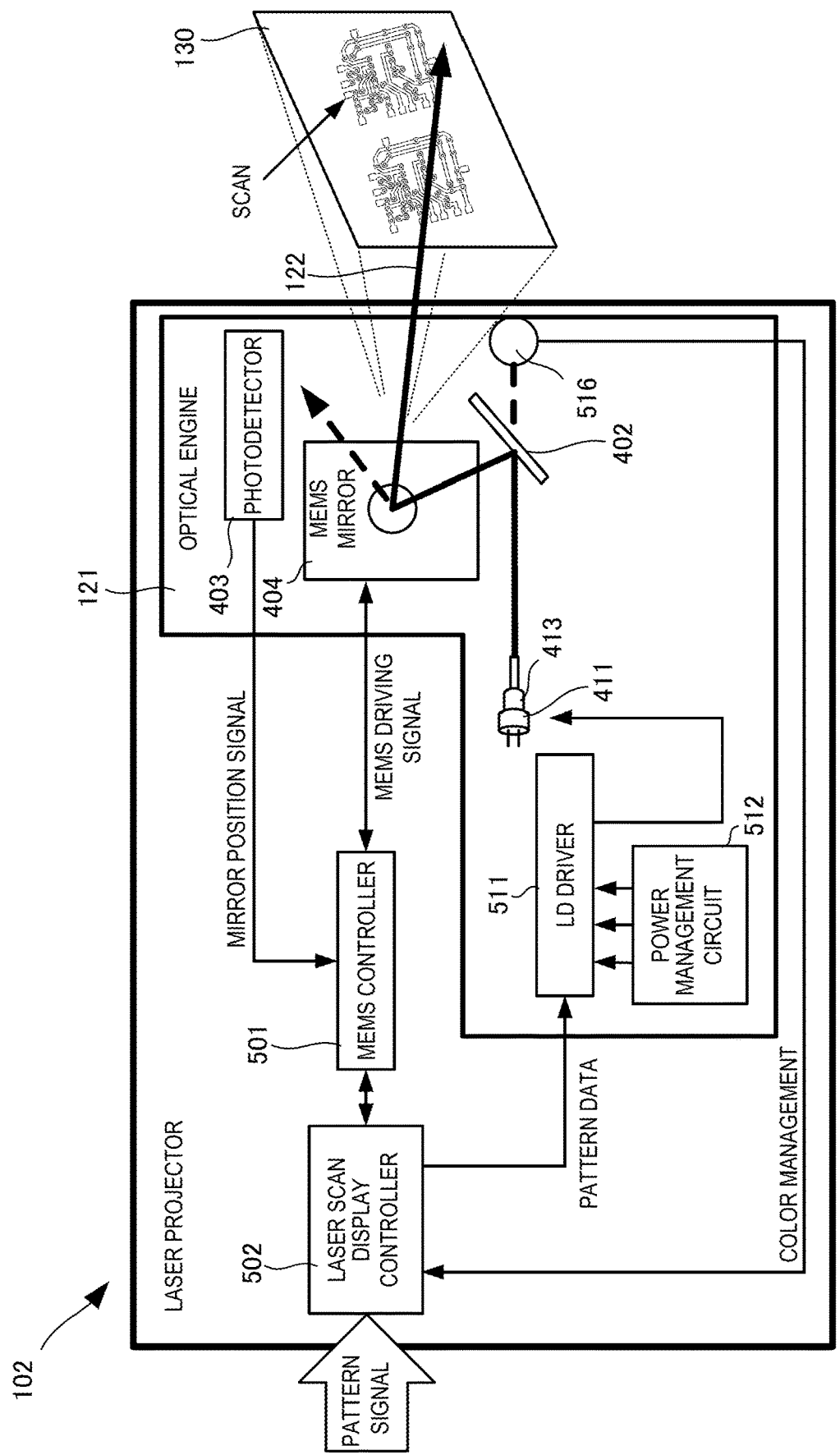
FIG. 5 is a view showing the arrangement of a laser projector including the optical engine of the pattern manufacturing apparatus according to the first example embodiment of the present invention.

FIG. 5 is a view showing the arrangement of the laser projector 102 including the optical engine 400 or 430 of the pattern manufacturing apparatus 100 according to this example embodiment. The optical engine 400 or 430 includes an LD driver 511, power management circuits (PMCs) 512, and a photodetector 516 in addition to the components described with reference to FIGS. 4A to 4C.

In addition to the optical engine 121, the laser projector 102 includes a MEMS controller 501 and a laser scan display controller 502. Upon receiving a pattern signal from the outside, the laser scan display controller 502 extracts a pixel count, a size, and the like, and transmits them to the MEMS controller 501.

The PMCs 512 control so the LD driver 511 does not erroneously operate during an initial transient period, for example, a rising period or falling period. Especially, during the transient period, the output power may be lower than a necessary voltage. The LD driver 511 may erroneously operate due to a low voltage and/or a variation in voltage. To avoid this problem, the functional circuit block can be set in a reset state during the transient period.

Figure 6:
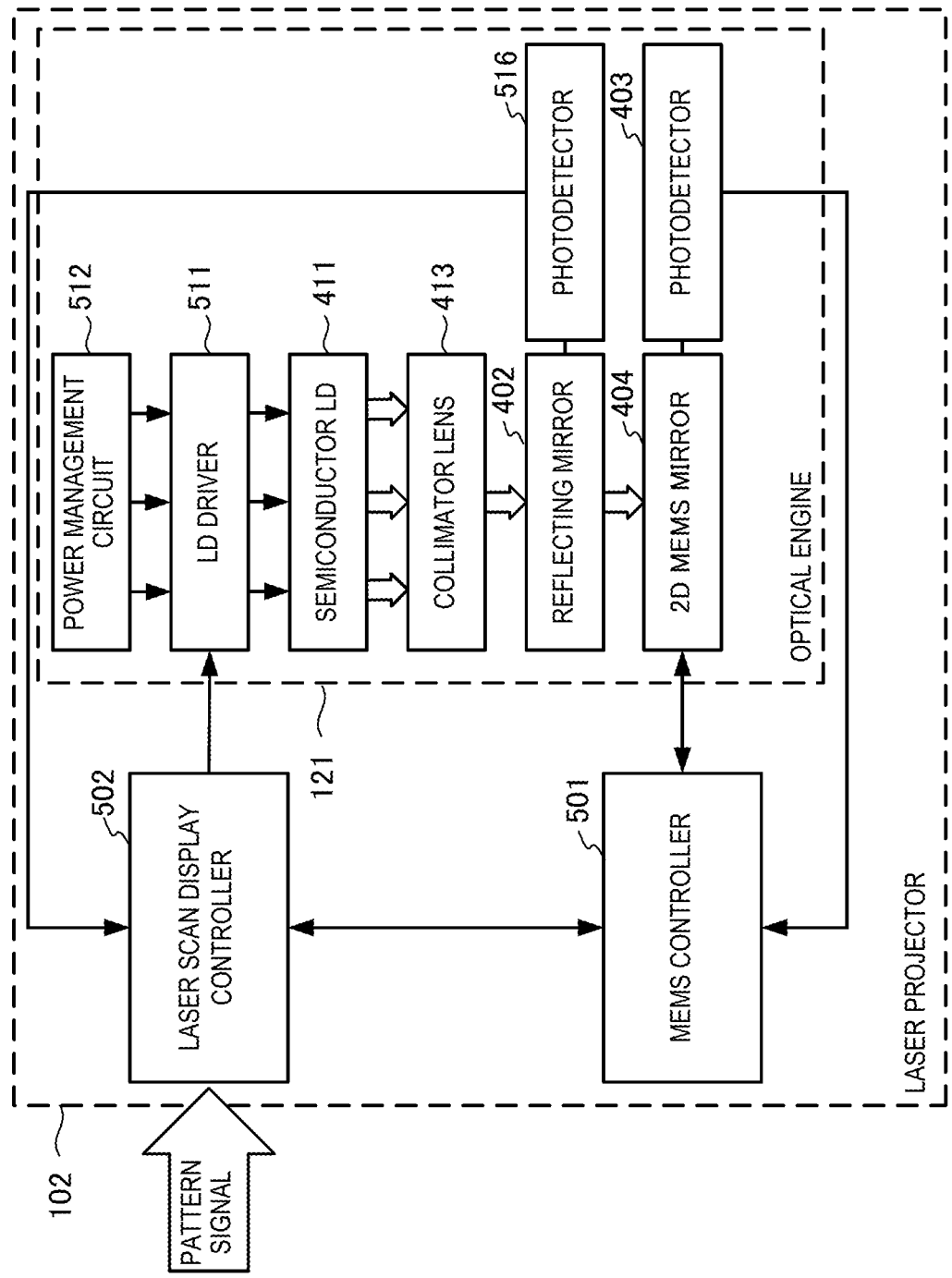
FIG. 6 is a block diagram showing the functional arrangement of the laser projector including the optical engine of the pattern manufacturing apparatus according to the first example embodiment of the present invention.

FIG. 6 is a block diagram showing the functional arrangement of the laser projector 102 including the optical engine 400 or 430 of the pattern manufacturing apparatus 100 according to this example embodiment. The pattern signal input to the laser scan display controller 502 is modulated, and sent to the LD driver 511. The LD driver 511 controls the luminance and irradiation timing of the laser beam projected by driving the LD. The laser scan display controller 502 drives the MEMS controller 501 at the same time to vibrate the two-dimensional MEMS mirror 404 with respect to two axes under a predetermined condition.

The power management circuit 512 controls the LD driver 511 to cause the semiconductor LD 411 to emit light at a predetermined voltage at a predetermined timing. The laser beam reflected by the two-dimensional MEMS mirror 404 through the optical systems such as the collimator lens 413 and the reflecting mirror 402 is projected on the pattern forming sheet 130 as a pattern forming laser beam. Note that the LD has been exemplified as a light source. The light source is not limited to the LD and may be an LED.

As described above, the MEMS scan method provides light utilization efficiency much higher than that in DLP (Digital Light Processing). Thus, the same pattern formation and shaping as those of DLP are possible with a laser of much lower power. That is, it is possible to reduce the cost and power consumption and decrease the size while achieving high accuracy. Furthermore, it is possible to narrow a laser beam ($\phi$0.8 mm→$\phi$0.02 mm), thereby improving the shaping accuracy. It is possible to change the irradiation area of the laser beam by changing the irradiation distance of the optical engine 121. The irradiation area of the laser beam may be changed by software without changing the irradiation distance of the optical engine 121.

Figure 7:
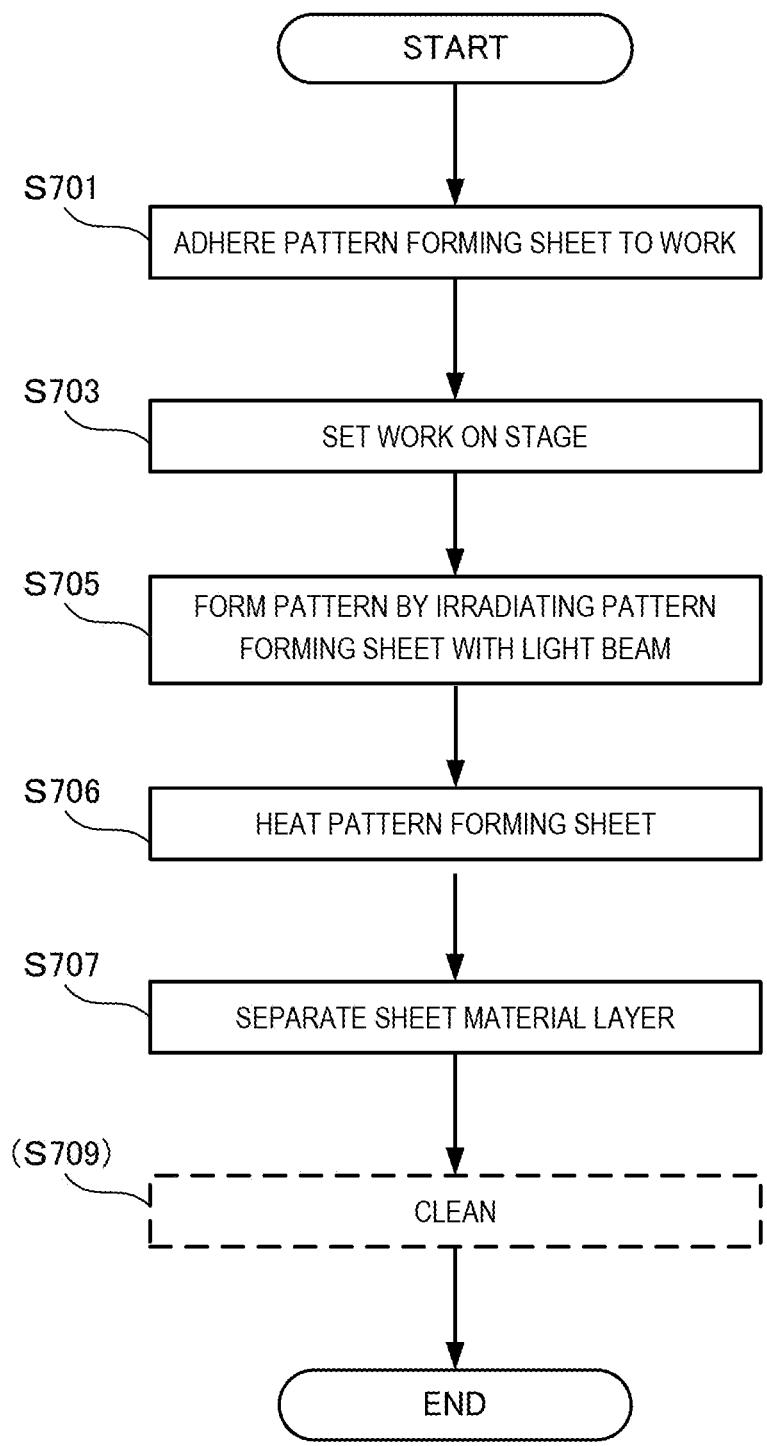
FIG. 7 is a flowchart for explaining a pattern manufacturing procedure by the pattern manufacturing apparatus according to the first example embodiment of the present invention.

FIG. 7 is a flowchart for explaining a pattern manufacturing procedure by the pattern manufacturing apparatus 100 according to this example embodiment. In step S701, the pattern forming sheet 130 is adhered to the work 200. The relation between the adhesions is as indicated by the pattern forming sheet 130 shown in FIG. 2C. Note that if the protection sheet 133 is attached to the pattern forming sheet 130, the protection sheet 133 is detached and then the pattern forming sheet 130 is adhered to the work 200.

In step S703, the work 200 to which the pattern forming sheet 130 is adhered is set on the stage 302. In step S705, the pattern manufacturing apparatus 100 irradiates the pattern forming sheet 130 with the light beam 122 such as a laser beam to cure the photo-curing layer 132, thereby forming a pattern. The pattern manufacturing apparatus 100 performs irradiation with, for example, a laser beam (light beam 122) having a wavelength of 405 nm, thereby curing the pattern. Note that irradiation with the light beam 122 may be performed by a scan or by a method of printing the entire pattern by one irradiation operation. If irradiation with the light beam 122 is performed by a scan, the scan count may be one or more. In step S706, the pattern manufacturing apparatus 100 heats the pattern forming sheet 130 by the heating wire heater. Note that step S706 may be executed simultaneously with step S705. Alternatively, step S706 may be executed before step S705.

In step S707, the sheet material layer 131 of the pattern forming sheet 130 is separated. The relation between the adhesions at this time is as indicated by the pattern forming sheet 130' shown in FIG. 2C. If the sheet material layer 131 is separated, the cured portion 220 of the photo-curing layer 132 remains on the side of the work 200, and the uncured portion 230 of the photo-curing layer 132 is separated from the work 200 together with the sheet material layer 131. If the uncured portion 230 remains on the side of the work 200 in step S707, for example, the uncured portion 230 is washed away by cleaning the work 200 using IPA (IsoPropyl Alcohol) in step S709. Note that the uncured portion 230 may be cleaned by executing ultrasonic cleaning together with cleaning by IPA. This can clean the uncured portion 230 more reliably. Upon completion of cleaning, the work 200 is dried. Note that step S709 is an additional step, and is executed, as needed.

By repeating the above-described steps, a three-dimensional pattern can be manufactured on the work 200. That is, it is possible to manufacture a three-dimensional pattern (laminated pattern) by repeating, after the end of the above-described steps, an operation of adhering a new pattern forming sheet 130 onto the pattern manufactured on the work 200 and manufacturing a pattern a predetermined number of times. In this case, the pattern forming sheets 130 made of different materials may be used for the respective layers.

Furthermore, if a conductive circuit pattern of a plurality of layers is shaped as a pattern, a resist layer (resist film) may be shaped between the layers. That is, after completion of shaping of the conductive circuit pattern, a resist layer forming sheet is adhered, as the pattern forming sheet 130, onto the conductive circuit pattern and a resist layer (resist pattern) is formed. On the resist layer, for example, a portion except for a portion serving as a through hole is irradiated with the light beam 122 and cured, and an uncured portion as the portion serving as the through hole is cleaned, thereby making it possible to shape the resist layer including a through hole. In addition to the resist layer, a layer having a waterproof function, dustproof function, and heat radiation function can be added by potting. Note that when shaping the conductive circuit pattern, the photo-curing layer 132 is made by mixing metal paste such as silver paste with a photo-curing resin. The present invention, however, is not limited to this. Furthermore, the pattern manufacturing apparatus 100 can be used as a laminating and shaping apparatus that shapes a three-dimensional laminated and shaped object by laminating a photo-curing resin, in addition to pattern shaping. That is, the pattern manufacturing apparatus 100 is a hybrid apparatus applicable to two applications of a pattern shaping apparatus and three-dimensional laminating and shaping apparatus.

According to this example embodiment, since the pattern forming sheet 130 having flexibility to fit in a work having an arbitrary shape is used, it is possible to shape a pattern on the work having the arbitrary shape. In addition, since the releasability between the sheet material layer 131 and the cured portion 220 of the photo-curing layer 132 is high, it is possible to readily shape a pattern on the work having the arbitrary shape by only separating the sheet material layer 131 after completion of light beam irradiation. Since cleaning of the uncured portion 230 of the photo-curing layer 132 after completion of light beam irradiation is not necessary, the shaping time of the pattern can be shortened. By using a plurality of pattern forming sheets 130, it is possible to manufacture a laminated pattern.

[Second Example Embodiment]

Figure 8:
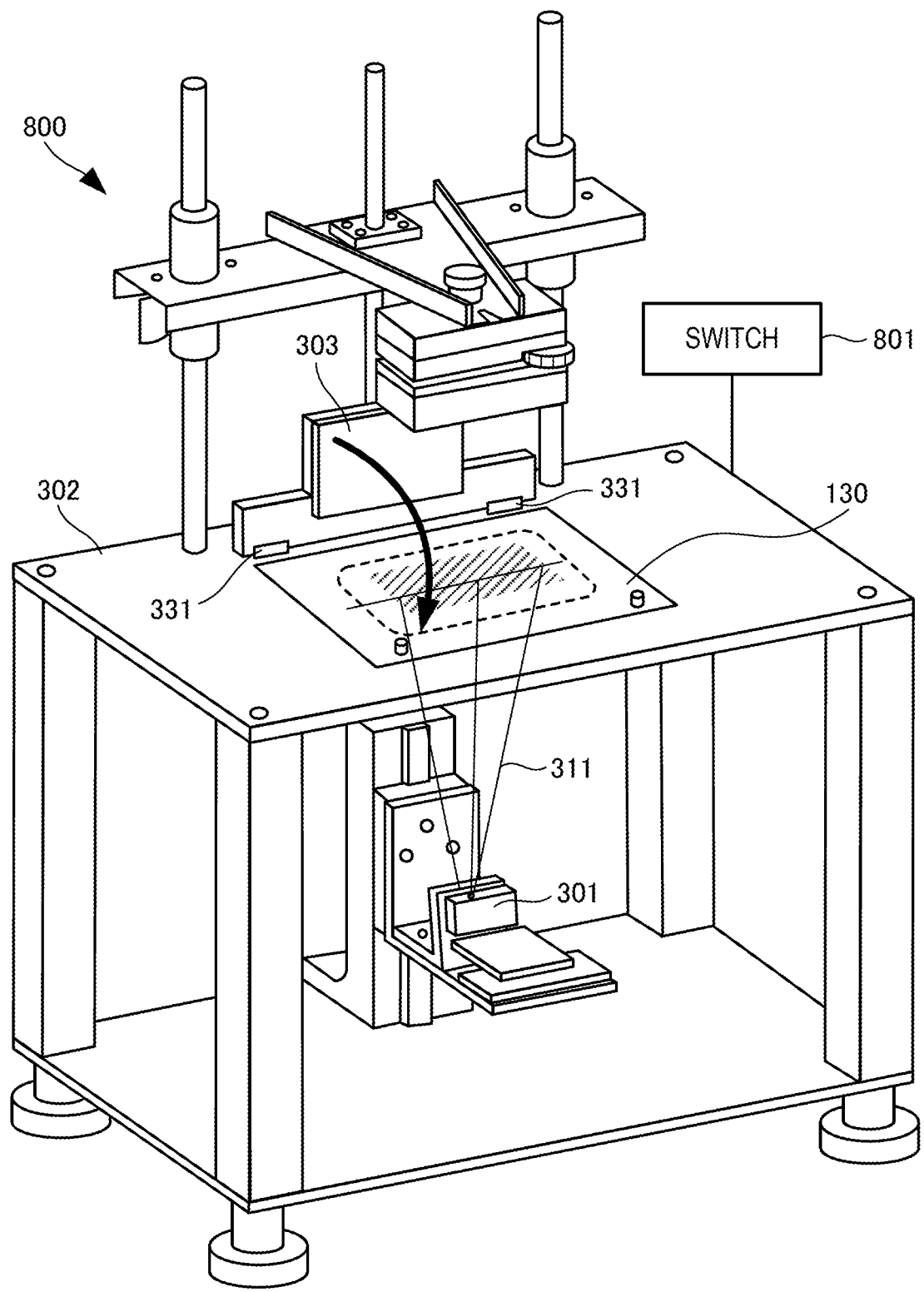
FIG. 8 is a view for explaining an example of the arrangement of a pattern manufacturing apparatus according to the second example embodiment of the present invention.

A pattern manufacturing apparatus according to the second example embodiment of the present invention will be described with reference to FIGS. 8 and 9. FIG. 8 is a view for explaining an example of the arrangement of the pattern manufacturing apparatus according to this example embodiment. A pattern manufacturing apparatus 800 according to this example embodiment is different from the first example embodiment in that a switch 801 is included. The remaining components and operations are the same as those in the first example embodiment. Hence, the same reference numerals denote the same components and operations, and a detailed description thereof will be omitted.

The pattern manufacturing apparatus 800 includes the switch 801. The switch 801 switches the rotation position of a heater 303. If the heater 303 is, for example, a heating wire heater, the rotation position of the heater 303 is set at a position where heat from the heating wire heater is transferred to a pattern forming sheet 130. Alternatively, if the heater 303 is, for example, an infrared heater, the rotation position of the heater 303 is set at a position where an infrared ray (heat) from the infrared heater reaches. For example, if a work 200 is a three-dimensional object, the heater 303 is set at a position where it is perpendicular to a stage 302, and the pattern forming sheet 130 adhered to the work 200 is heated by the infrared heater. Furthermore, when forming a pattern on the pattern forming sheet 130, the heater 303 is set at a position where it is parallel to the stage 302. Then, the pattern forming sheet 130 is sandwiched between the stage 302 and the heater 303 and heated by the heating wire heater. Note that the rotation position of the heater 303 is not limited to the above positions. Furthermore, the switch 801 may switch between the processes shown in FIGS. 7 and 9.

Figure 9:
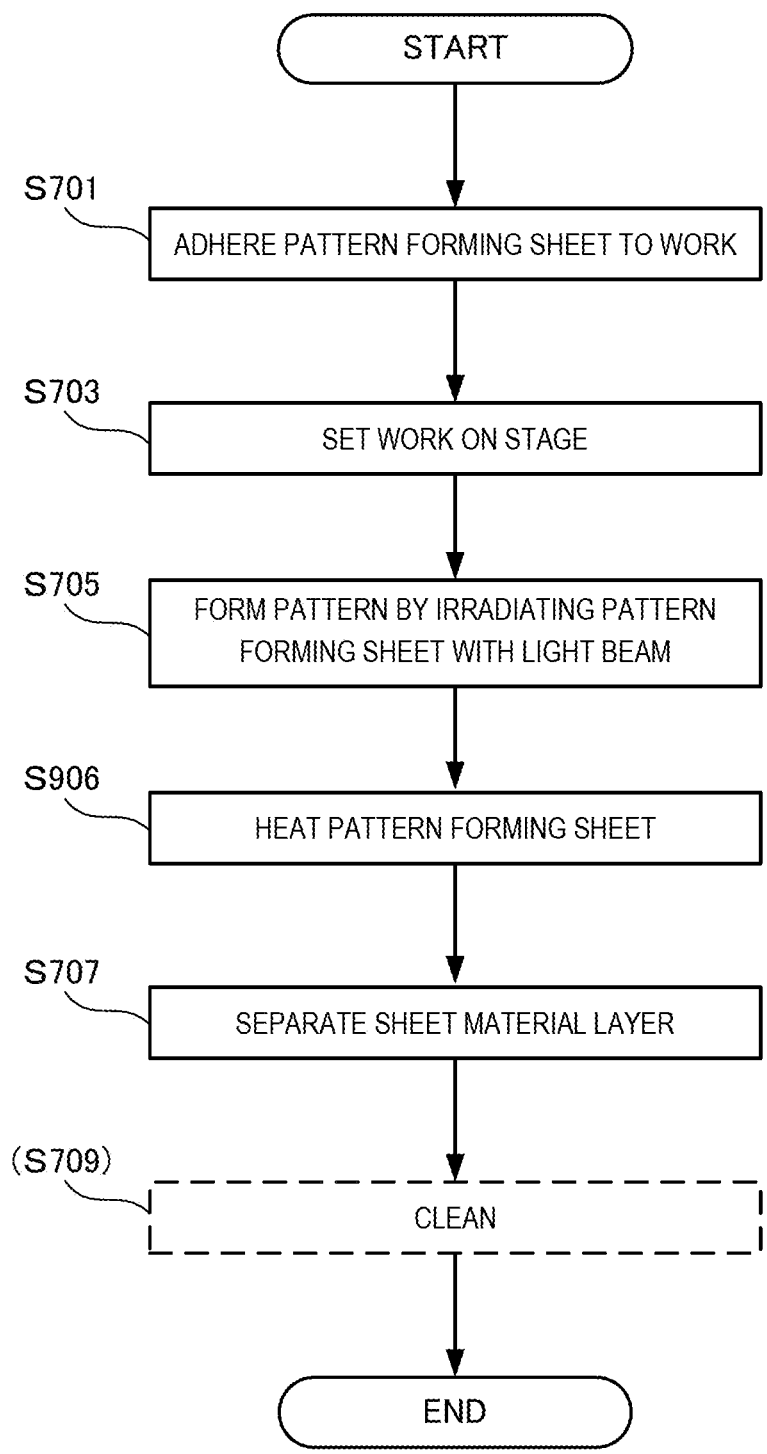
FIG. 9 is a flowchart for explaining a pattern manufacturing procedure by the pattern manufacturing apparatus according to the second example embodiment of the present invention.

FIG. 9 is a flowchart for explaining a pattern manufacturing procedure by the pattern manufacturing apparatus 800 according to this example embodiment. Note that the same step numbers as those in FIG. 7 denote the same steps and a description thereof will be omitted. In step S906, the pattern manufacturing apparatus 800 heats the pattern forming sheet 130 by the infrared heater. Note that step S906 may be executed simultaneously with step S705. Alternatively, step S906 may be executed before step S705.

According to this example embodiment, since the switch is provided, it is possible to set the position of the heater in accordance with a heating method. Furthermore, since the pattern manufacturing apparatus including the heater is used, it is possible to decrease the resistance value of the circuit pattern. If heating is performed simultaneously with shaping of the circuit pattern, it is possible to shape the circuit pattern and decrease the resistance value of the circuit pattern at the same time. In addition, since heating accelerates curing of the photo-curing resin, the shaping time can be shortened. Note that instead of the circuit board, a work like a wine glass 310 shown in FIG. 3 can be applied to the pattern manufacturing apparatus 800 of FIG. 8 provided with the heater. In this case, the heater 801 can decrease the specific volume of a photo-curing layer 132 within a short time by aging the sheet 130 on the wine glass 310 by heating. As a result, it is possible to quickly obtain the final shape of the photo-curing layer 132 on the pattern forming sheet 130.

[Other Example Embodiments]

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

The present invention is applicable to a system including a plurality of devices or a single apparatus. The present invention is also applicable even when an information processing program for implementing the functions of example embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described example embodiments.

What is claimed is:

1. A pattern manufacturing apparatus comprising:
    a forming unit that forms a pattern by irradiating a pattern forming photocuring layer with a light beam;
    a heater that heats the pattern forming photo-curing layer in order to decrease a resistance value of the pattern; and
    a switch that switches said heater to be set at a plurality of rotation positions, wherein said heater is attached to a stage via a hinge and rotates about the hinge.

2. The apparatus according to claim 1, wherein the pattern forming photocuring layer is included in a pattern forming sheet.

3. The apparatus according to claim 2, further comprising:
    a switch that switches said heater to be set at a plurality of rotation positions.

4. The apparatus according to claim 2, wherein said heater includes a heating wire heater, and is set at a first position where heat is transferred to the pattern forming photo-curing layer.

5. The apparatus according to claim 2, wherein said heater includes an infrared heater, and is set at a second position where an infrared ray reaches the pattern forming photo-curing layer.

6. The apparatus according to claim 1, wherein said heater includes a heating wire heater, and is set at a first position where heat is transferred to the pattern forming photo-curing layer.

7. The apparatus according to claim 6, wherein said heater includes an infrared heater, and is set at a second position where an infrared ray reaches the pattern forming photo-curing layer.

8. The apparatus according to claim 1, wherein said heater includes an infrared heater, and is set at a second position where an infrared ray reaches the pattern forming photo-curing layer.

9. A control method of a pattern manufacturing apparatus including a forming unit that forms a pattern by irradiating a pattern forming photocuring layer with a light beam, a heater that heats the pattern forming photo-curing layer in order to decrease a resistance value of the pattern, and a switch that switches said heater to be set at a plurality of rotation positions, wherein said heater is attached to a stage via a hinge and rotates about the hinge, the method comprising forming a pattern by irradiating a pattern forming photo-curing layer with a light beam; and heating the pattern forming photo-curing layer.

10. The apparatus according to claim 9, wherein said heater includes an infrared heater, and is set at a second position where an infrared ray reaches the pattern forming photo-curing layer.

11. A non transitory computer readable medium storing a pattern manufacturing program of a pattern manufacturing apparatus including a forming unit that forms a pattern by irradiating a pattern forming photocuring layer with a light beam, a heater that heats the pattern forming photo-curing layer in order to decrease a resistance value of the pattern, and a switch that switches said heater to be set at a plurality of rotation positions, wherein said heater is attached to a stage via a hinge and rotates about the hinge, the pattern manufacturing program causing a computer to execute a control method, comprising forming a pattern by irradiating a pattern forming photo-curing layer with a light beam; and heating the pattern forming photo-curing layer.

* * * * *